United States Patent [19]

Ballman et al.

[11] Patent Number: 5,039,187
[45] Date of Patent: Aug. 13, 1991

[54] $M_{1-x}N_xTIAS_{1-a}P_aO_5$ WAVEGUIDES GROWN BY LIQUID PHASE EPITAXY AND PROCESS OF MAKING SAME

[75] Inventors: Albert A. Ballman, Toms River, N.J.; Lap K. Cheng, Bear, Del.

[73] Assignee: E. I. Du Pont de Nemours and Company, Wilmington, Del.

[21] Appl. No.: 578,115

[22] Filed: Sep. 6, 1990

[51] Int. Cl.[5] .......................... G02B 6/10; G02B 6/00; C30B 7/00

[52] U.S. Cl. .................................... 385/130; 156/624; 156/DIG. 71; 156/DIG. 75; 156/DIG. 81; 156/607; 385/141

[58] Field of Search ............... 350/96.11, 96.12, 96.30, 350/96.34, 320; 156/622, 624, DIG. 71, DIG. 75, DIG. 81, 607; 427/164

[56] References Cited

U.S. PATENT DOCUMENTS

| | | | |
|---|---|---|---|
| 3,810,688 | 5/1974 | Ballman et al. | 350/96.12 |
| 3,811,912 | 5/1974 | Ramaswamy | 350/96.12 X |
| 3,830,654 | 8/1974 | Cho | 350/96.34 X |
| 3,880,630 | 4/1975 | Izawa | 350/96.12 X |
| 3,998,687 | 12/1976 | Ballman et al. | 156/619 |
| 4,073,675 | 2/1978 | Ballman et al. | 156/600 |
| 4,740,265 | 4/1988 | Bierlein et al. | 350/96.34 X |
| 4,766,954 | 8/1988 | Bierlein et al. | 156/624 |
| 4,917,451 | 4/1990 | Chouinard et al. | 350/96.14 |

Primary Examiner—Brian Healy

[57] ABSTRACT

Optical waveguides prepared by liquid phase epitaxy comprising a film of $M_{1-x}N_xTiAs_{1-a}P_aO_5$ on a substrate of $MTiAs_{1-(a+b)}O_5P_{(a+30\,b)}$ is disclosed.

27 Claims, 6 Drawing Sheets

$M_{1-x}N_xTiAs_{1-a}P_aO_5$ WAVEGUIDES GROWN BY LIQUID PHASE EPITAXY AND PROCESS OF MAKING SAME

FIELD OF THE INVENTION

The present invention relates to a novel optical waveguide prepared by liquid phase epitaxy, comprising a film of $M_{1-x}N_xTiAs_{1-a}P_aO_5$ on a substrate of $MTiAs_{1-(a+b)}P_{a+b}O_5$.

BACKGROUND OF THE INVENTION

Potassium titanyl phosphate ($KTiOPO_4$) has long been recognized as an outstanding material for many important optical and electro-optical applications. The basic element of optical communications systems is the optical waveguide which transmits or guides optical waves from one point to another and serves to connect various devices in an optical integrated circuit.

U.S. Pat. No. 4,766,954 of Bierlein et al., issued Aug. 30, 1988, discloses an ion exchange process for producing an optical waveguide by contacting a single crystal of $K_{1-x}Rb_xTiOMO_4$ wherein x is 0 to 1 and M is P or As with a molten salt of Rb, Cs or Tl for a time sufficient to increase the surface index of refraction with respect to that of the starting crystal.

U.S. Pat. No. 4,740,265 of Bierlein et al., issued Apr. 26, 1988, claims the resulting waveguide and its use in an optical waveguide device prepared by the process of the above patent.

Bierlein et al., Appl. Phys. Lett., Vol. 50, No. 18, pp. 1216–1218, May 4, 1987, discloses the fabrication and characterization of planar and channel optical waveguides in $KTiOPO_4$ using ion exchange processes.

U.S. Pat. No. 3,998,687 of Ballman et al., issued Dec. 21, 1976, discloses a liquid phase epitaxial growth technique for optical waveguides comprising lithium niobate films on lithium tantalate substrates using particular flux systems.

Bierlein et al., Appl. Phys. Lett., Vol. 54, No. 9, pp. 783–785, Feb. 27, 1989, discusses the linear and nonlinear optical properties of flux-grown $KTiOAsO_4$.

Morris et al., Mat. Res. Soc. Symp. Proc., Vol. 2, pp. 95–101 (1989) discusses defects in the nonlinear optical crystal $KTiOPO_4$ and relates its properties of ionic conductivity and damage susceptibility to the specific technique and conditions used for growth.

Waveguides in $KTiOPO_4$ consist primarily of the cationic solid solution $K_xM_{1-x}TiOPO_4$, wherein M can be rubidium, cesium, or thallium, formed mainly by an ionexchange process. The ionic conductivity of $KTiOPO_4$ varies significantly with crystal growth method and impurities, making the device fabrication process difficult and with poor yields. This broad variability in the ionic conductivity is problematic and can limit the development of highly efficient waveguide frequency doubling devices. Due to the inherently diffusive nature of the ion exchange process, ion-exchanged waveguides generally exhibit a diffused refractive index profile along one axis which is believed to be responsible for variation in the performance of these devices. This type of index profile, though satisfactory for many applications, is less effective in the confinement of optical fields, which in turn makes the devices less useful in applications such as waveguide second harmonic generation.

It is therefore an object of the present invention to provide an optical waveguide with a well defined step-like refractive index profile.

It is a further object of the present invention to provide an optical waveguide in which the diffusiveness due to conductivity does not significantly affect its waveguiding properties.

It is a further object of the present invention to provide a liquid phase epitaxy process for the preparation of waveguides having the above properties.

SUMMARY OF THE INVENTION

The present invention comprises an optical waveguide comprising homogeneous film of $M_{1-x}N_xTiAs_{1-a}P_aO_5$ on a substrate of $MTiAs_{1-(a+b)}P_{a+b}O_5$ wherein M and N are each independently potassuim, rubidium, cesium, or thallium;
a is 0 to 1;
b is greater than 0 and less than or equal to $(1-a)$;
$(a+b)$ is greater than 0 and less than or equal to 1; and
x is 0 to 1, said film is heteroepitaxial with respect to said substrate; and the refractive index of said film is greater than the refractive index of said substrate by at least about 0.001; provided that when M or N is rubidium, the concentration of rubidium in the film is equal to that in the substrate.

The present invention further comprises a process for the liquid phase epitaxial growth of a thin film of $M_{1-x}N_xTiAs_{1-a}P_aO_5$ on a substrate of $MTiAs_{1-(a+b)}P_{a+b}O_5$ wherein M, N, a, b, (a+b) and x are as defined above; and wherein said film is heteroepitaxial with respect to said substrate, and the refractive index of said film is greater than the refractive index of said substrate by at least about 0.001, provided that when M or N is rubidium, the concentration of rubidium in the film is equal to that in the substrate; comprising the steps of immersing substrate seed crystal into a supercooled melt of a suitable flux, withdrawing the seed crystal from the melt, and effecting cooling thereof, resulting in supersaturation of the flux solution on the seed and growth of a film of $M_{1-x}N_xTiAs_{1-(a+b)}P_{(a+b)}O_5$. The present invention further comprises the waveguide prepared by this process.

The present invention further comprises a process for producing an optical waveguide comprising the above described liquid phase epitaxy process as a first step, followed by contacting the resulting substrate and film with a molten salt or mixture of molten salts of at least one salt of rubidium, cesium, thallium, strontium, calcium, zinc or barium at a temperature of from about 200° to about 600° C. The present invention further comprises the waveguide prepared by this process.

DETAILED DESCRIPTION OF THE INVENTION

Figure 2:
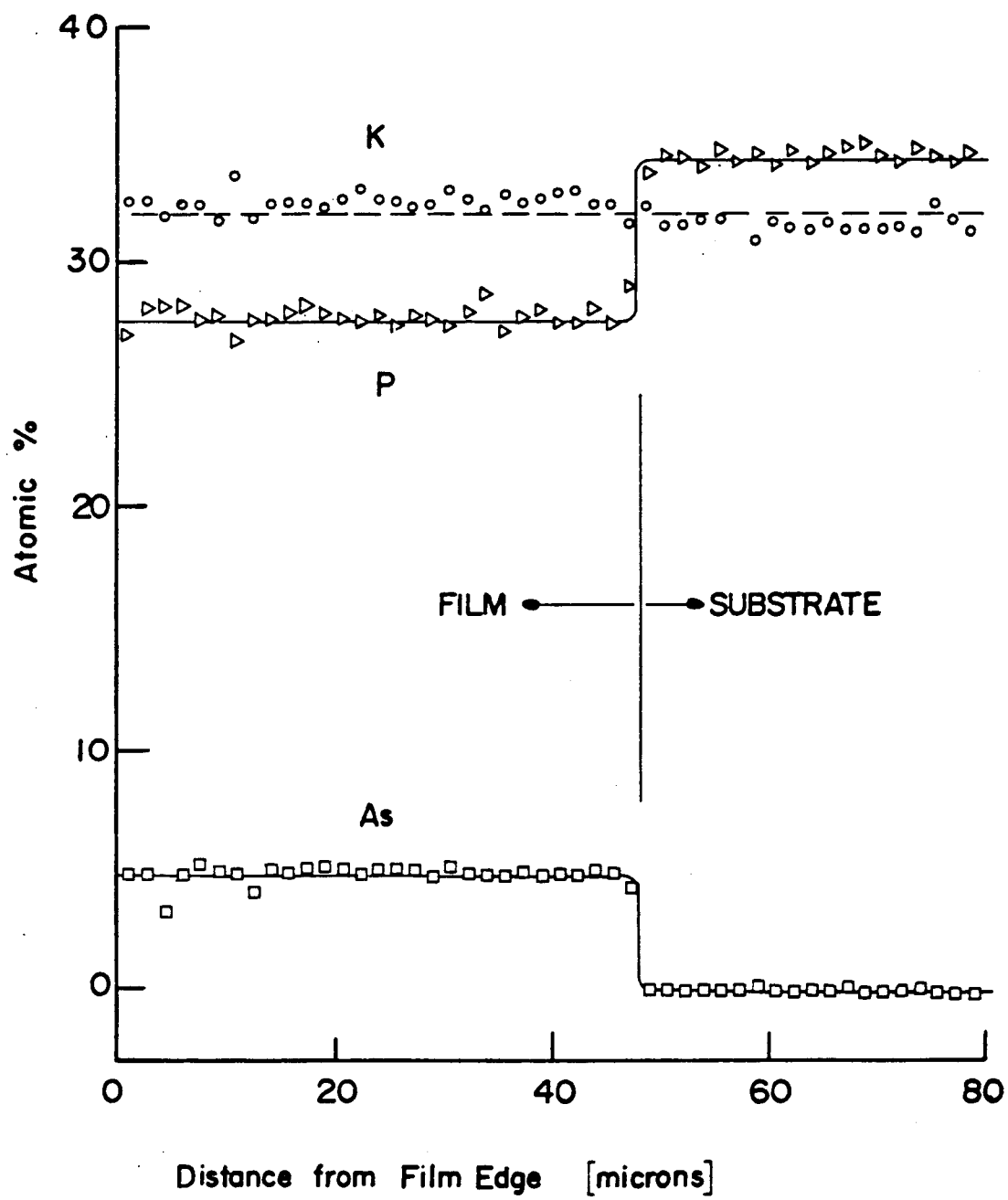
FIG. 2 depicts an energy-dispersive X-ray spectrometry profile of a 50 μm thick $KTiOP_{0.76}As_{0.24}O_4$ film on a $KTiOPO_4$ substrate omitting the titanium profile. The spatial resolution is 0.5 μm.

As an alternative to directly addressing the ionic conductivity problem, and as a means to more effectively confine the optical wave to yield higher power density, the present invention provides films with a well defined step-like refractive index profile as shown in FIG. 2, grown directly by liquid phase epitaxy onto an appropriate substrate. Effective waveguiding is obtained by satisfying the condition that the refractive index of the film be higher than that of the substrate. Deep channel waveguides can be fabricated on these heteroepitaxial films. As the evanescent wave barely penetrates into the substrate, fluctuation in the diffusive profile of these channel guides will not significantly affect their waveguiding properties, thereby avoiding the problem of ionic conductivity.

The present invention comprises an optical waveguide comprising an homogeneous film of $M_{1-x}N_xTiAs_{1-a}P_aO_5$ on a substrate of $MTiAs_{1-(a+b)}P_{a+b}O_5$ wherein M and N are each independently potassuim, rubidium, cesium, or thallium;
a is 0 to 1;
b is greater than 0 and less than or equal to (1−a);
(a+b) is greater than 0 and less than or equal to 1; and
x is 0 to 1,
said film being heteroepitaxial with respect to said substrate; and the refractive index of said film being greater than the refractive index of said substrate by at least about 0.001, provided that when M or N is rubidium, the concentration of rubidium in the film is equal to that in the substrate.

Preferred are waveguides wherein M and N are each potassium, rubidium or thallium. For economic reasons, most preferred are those wherein M and N are each potassium.

In order to obtain waveguiding properties the refractive index of the film ($\eta_f$) must be greater than that of the substrate ($\eta_s$) by about at least 0.001. Preferably $\eta_f - \eta_s$ is from about 0.001 to about 0.06. Most preferred is that $\eta_f - \eta_s$ is from about 0.001 to about 0.03.

For optical applications, both the optical quality and the thickness of the epitaxial films should be well controlled. Of the numerous factors that can affect the film quality, one important factor is lattice matching. The device described here can be generically described as a film of the composition $M_{1-x}N_xTiAs_{1-a}P_aO_5$ grown on a $MTiOAs_{1-(a+b)}P_{a+b}O_4$ substrate as defined above. As the phosporous content in the crystal decreases, the unit cell volume increases. Guinier X-ray measurement of powder samples reveals that the lattice constants ($a_o$, $b_o$ and $c_o$) for the solid solution $KTiOP_{1-(a+b)}As_{a+b}O_4$ can be predicted with acceptable accuracy by Vegard's Law using the coefficients defined below:

$a_o(y) = (0.0031 \text{ Å}/\%)(y) + 12.813$ Å

$b_o(y) = (0.0017 \text{ Å}/\%)(y) + 6.4035$ Å

$c_o(y) = (0.0020 \text{ Å}/\%)(y) + 10.588$ Å wherein y = 1 − (a+b).

The positive coefficients in these expressions suggest that the epitaxial films are under compressive stress, which has been well recognized as being more favorable than the reverse case of tensile stress.

Figure 4:
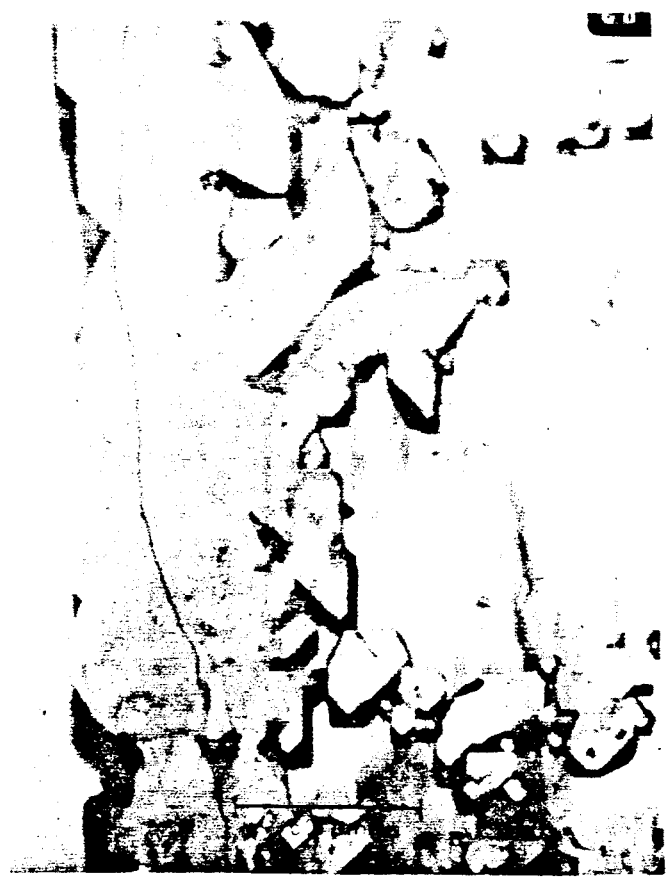
FIG. 4 is a microphotograph showing scaling of a film of KTiOAsO$_4$ on a KTiOP$_{0.44}$As$_{0.56}$O$_4$ substrate due to excessive lattice mismatch.

For the growth of $KTiOAs_{1-a}P_aO_4$ films of up to about 10-30 μm, we found that the preferred film/substrate combination is for b≦0.35, which corresponds to a lattice mismatch of ≦1%. Larger values of b tend to cause film cracking and scaling, which significantly increases the scattering loss in the resulting films. FIG. 4 is a photomicrograph that shows scaling of film which can occur due to excessive lattice mismatch. Of course, the absolute limits for the lattice mismatch, b(max.), depends on the film thickness, the growth temperature, and the substrate orientation. Also, for the other cationic isomorphs, the lattice mismatch limit b(max.) will be different. For instance, Vegard's law predicted that in the system of $RbTiOAs_{1-a}P_aO_4$ film on $RbTiOAs_{1-(a+b)}P_{a+b}O_4$ substrate, a 1% lattice mismatch corresponds to a b(max.) of about 0.5.

There is also a substrate orientation effect on film quality. High quality epitaxial films can be grown on all naturally ocurring facets of KTiOPO$_4$. Furthermore, using a tungstate flux, we have observed that a (111) oriented substrate which is absent in bulk crystals, produces a high quality film. This suggests that certain crystallographic planes other than the {100}, {201}, {110} and {011} may be useful in the growth of smooth, optical quality waveguides. However, it will be practically impossible to determine all of these planes as there are an infinite number of non-morphological faces in any crystal.

Figure 5:
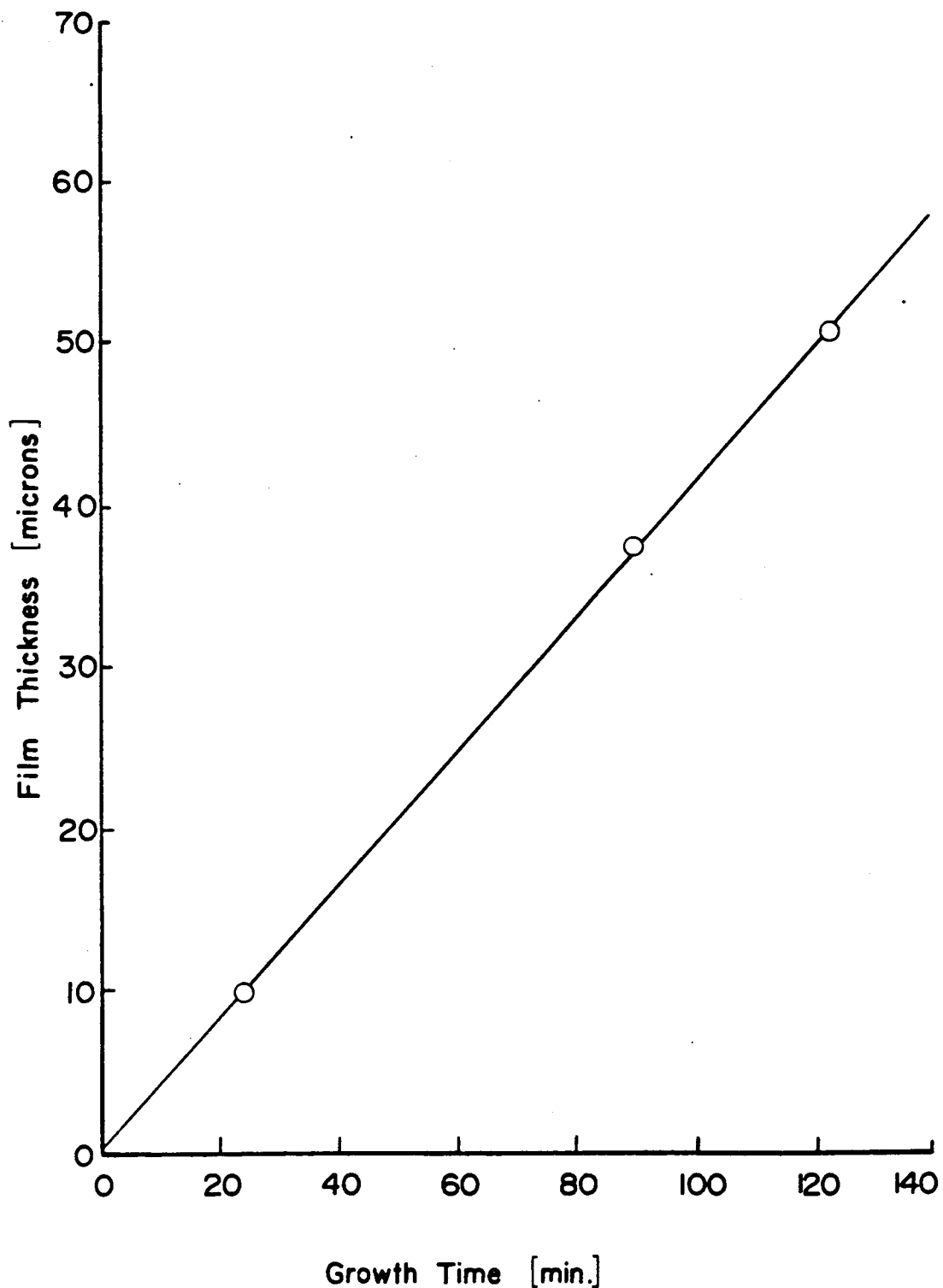
FIG. 5 is a graph of film thickness versus growth time.

For waveguiding applications, the desired film thickness ranges from about 0.5 to about 50 μm. Preferably film thickness is from about 3 to 5 microns. The various film thicknesses are obtained by controlling growth rate through the degree of supersaturation and the dipping time. Due to the strongly nonlinear dependence of growth rate on supersaturation, it is more convenient to control the film thickness by adjustment in the dipping time, which was observed to be highly linear with respect to film thickness (i.e., constant growth rate). This is demonstrated in FIG. 5. Dipping times ranging from about 6 to 1,140 minutes have been used with good results. The range of observed average growth rates are from about 0 Å/sec (i.e., unmeasureable) to about 31.3 Å/sec. It should be noted that in order to reproducibly grow films that are several microns thick, it is necessary to fabricate the substrate such that it is precisely oriented in the desired crystallographic direction (e.g., normal to (011)). Any vicinal property of the substrate manifests itself as a fast two dimensional growth of the substrate (in contrast to the normal outward growth of a singular face), giving films that are either wedged or films with a rippled as grown surface.

Figure 6:
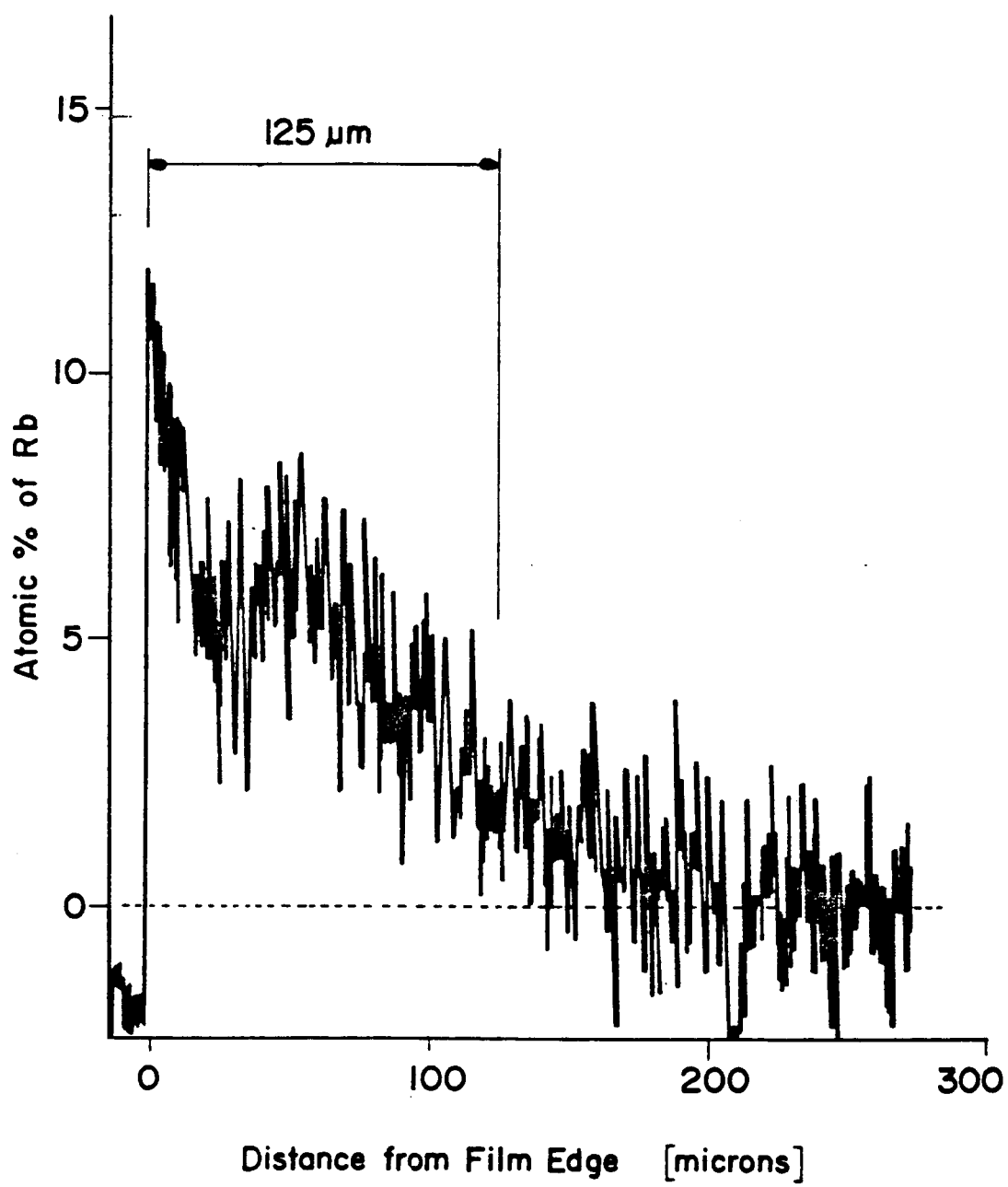
FIG. 6 is an energy-dispersive X-ray spectrometry profile of a 50 82 m thick Rb$_y$K$_{1-y}$TiOPO$_4$ film on a KTiOPO4 substrate for the rubidium profile showing diffusive broadening of the 50 82 m thick film to about 125 82 m.

For waveguides containing rubidium in the film or substrate, the concentration of rubidium in the film must be about equal to that in the substrate in order to obtain a film having a step-like refractive index profile. If the rubidium concentration in the film and substrate are not approximately equal, a film having a broad diffusive refractive index profile is obtained. This is demonstrated in FIG. 6 depicting an energydispersive X-ray spectrometry profile of a 50 μm thick $Rb_yK_{1-y}TiOPO_4$ film on a $KTiOPO_4$ substrate. The concentration of rubidium decreases with greater distance from the film edge. At about 50 μm from the edge where the film ends and the substrate begins, there is about 6% rubidium present, indicating that rubidium is present in the substrate via ion-exchange.

The present invention further comprises a process for the liquid phase epitaxial growth of a thin film of $M_{1-x}N_xTiAs_{1-a}P_aO_5$ on a substrate of $MTiAs_{1-(a+b)}P_{a+b}O_5$ wherein M, N, a, b, (a+b) and x are as previously defined above; and wherein said film is heteroepitaxial with respect to said substrate, and the refractive index of said film is greater than the refractive index of said substrate by at least about 0.001, provided that when M or N is rubidium, the concentration of rubidium in the film is equal to that in the substrate; comprising the steps of immersing substrate seed crystal into a supercooled melt of a suitable flux, withdrawing the seed crystal from the melt, and effecting cooling thereof, resulting in supersaturation of the flux solution on the seed and growth of a precipitated film of $M_{1-x}N_xTiAs_{1-(a+b)}P_{a+b}O_5$.

A charge consisting of the solution (flux) and the solute ($KTiOAs_{1-(a+b)}P_{(a+b)}O_4$), with the appropriate phosphorous to arsenic (i.e., [P]/[As]) ratio, is melted into a platinum crucible in a standard, top-loading crystal growth furnace. The relative concentration of the flux and the solute are chosen to give the desired liquidus temperature at which the epitaxial growth is to be carried out.

The mixture is soaked overnight at about 50°–100° C. above its liquidus temperature to yield a homogeneous solution. The solution is then cooled at about 10°–30° C./hour to about 10° C. above the liquidus temperature and allowed to reach thermal equilibrium. One or more polished substrate plates with the desired chemical composition, thickness and orientation are then slowly lowered into the crystal growth chamber with the help of a mechanical device (known as as a crystal pulling head) capable of rotation and translation. The substrates are then positioned about 5–10 mm above the melt surface and the entire crystal growth system is programmed to cool to about 3°–5° C. below the liquidus temperature. This is the growth temperature. After the system has equilibrated at the growth temperature for about 45 minutes, the substrate is then submerged into the melt and spun at about 5–10 rpm. The duration of the dipping varies depending on the desired thickness of the film. Upon completion, the substrates, now with the waveguiding film, are withdrawn from the melt and very slowly pulled out of the furnace to room temperature. The final step of the growth process involves placing the crystals in a warm dilute HCl solution which dissolves the virteous flux coating surrounding the films.

The quality of LPE films often depends significantly on the processing history of the substrate. In the present invention, the substrates are first lapped with abrasive slurries to yield two parallel surfaces and to remove scratches caused by the sawing process. A final chemical-mechanical polish of about 30 seconds using 0.05 μm colloidal silica gives substrate surfaces smooth enough for liquid phase epitaxy. It has been observed that substrates cleaned in warm, dilute (0.5%) HCl prior to dipping can significantly improve the quality of the resulting film. Similarly, liquid phase epitaxy films with the best substrate/film interface quality are generally obtained by preceding the growth with a slight dissolution of the substrate. This back-etching is readily accomplished by submerging the crystal into the melt roughly 5–10 minutes before the crystal growth furnace settles down at the desired growth temperature.

Fluxes suitable for use in the process of the present invention include tungstate, phosphate, arsenate, molybdate, sulfate or halide fluxes known in the art, or a combination thereof, which results in crystallization Of $M_{1-x}N_xTiAs_{1-a}P_aO_5$ as the only stable solid phase. Preferred are the tungstate or phosphate/arsenate fluxes.

Both the tungstate flux and the pure phosphatearsenate self flux were used in our experiments as shown in the following examples. The exact composition of the preferred tungstate flux is $3K_2WO_4 \bullet 3KP_zAs_{1-z} \bullet Li_2WO_4$. The exact value of z depends on the arsenic content of the film, and can be evaluated from the partition coefficient $\kappa$ given in Table 3. The preferred self-flux consists of the phosphate-arsenate analog of the $K_6P_4O_{13}$ flux (abbrevated as $K_6$ below) used for bulk KTP growth. The relative crystal-flux compositions are chosen such that the growth temperatures are about 850° C. Although a significantly lower growth temperature is possible using the tungstate, the $K_6$ flux becomes far too viscous for high quality growth below 750° C. The relatively high growth temperatures used in growth from the tungstate permits meaningful comparisons of the results using these two fluxes.

The lattice constants for several members of the potassium titanyl phosphate family are summarized in Table 1.

TABLE 1

Lattice constants of several KTP isomorphs

| Crystal | | Lattice Constants | | | Cell Volume [Å³] |
|---|---|---|---|---|---|
| | | $a_o$ [Å] | $b_o$ [Å] | $c_o$ [Å] | |
| $KTiOPO_4$ | (KTP) | 12.822 | 6.4054 | 10.589 | 869.67 |
| $RbTiOPO_4$ | (RTP) | 12.964 | 6.4985 | 10.563 | 889.89 |
| $TlTiOPO_4$ | (TTP) | 12.983 | 6.490 | 10.578 | 891.30 |
| $KTiOAsO_4$ | (KTA) | 13.125 | 6.5716 | 10.786 | 930.31 |
| $RbTiOAsO_4$ | (RTA) | 13.257 | 6.6780 | 10.765 | 953.03 |
| $CsTiOAsO_4$ | (CTA) | 13.486 | 6.8616 | 10.688 | 989.02 |
| $TlTiOAsO_4$ | (TTA) | 13.208 | 6.6865 | 10.724 | 947.09 |

Among the many possible film/substrate combinations, the KTA/KTP, potassium titanyl arsenate/potassium titanyl phosphate system is most preferred. As the titanyl group is primarily responsible for the optical nonlinearity, replacement of titanium with other tetravalent ions are expected to lead to a significant loss in the nonlinearity. The arsenic for phosphorous substitution used here provides the needed refractive index increase without compromising on the nonlinearity.

The experimental lattice constants for a solid solution of $KTiOAs_{1-a}P_1O_4$ are summarized in Table 2, with calculated values shown in parenthesis.

TABLE 2

$KTiOAs_{1-a}P_aO_4$ (Theoretical)

| P | As | $a_o$ | $b_o$ | $c_o$ |
|---|---|---|---|---|
| 100.0 | 0.0 | 12.813 | 6.4035 | 10.588 |
| 76.0 | 24.0 | 12.891 | 6.4421 | 10.635 |
| 70.7 | 29.3 | (12.904) | (6.4533) | (10.647) |
| 60.9 | 39.1 | (12.934) | (6.4700) | (10.666) |
| 46.9 | 53.1 | (12.978) | (6.4938) | (10.694) |
| 41.0 | 59.0 | 12.997 | 6.5069 | 10.705 |

TABLE 2-continued

| | KTiOAs$_{1-a}$P$_a$O$_4$ (Theoretical) | | | |
|---|---|---|---|---|
| P | As | a$_o$ | b$_o$ | c$_o$ |
| 18.7 | 81.3 | (13.065) | (6.5417) | (10.753) |
| 17.4 | 82.6 | (13.069) | (6.5439) | (10.753) |
| 14.6 | 85.4 | (13.078) | (6.5487) | (10.759) |
| 0.0 | 100.0 | 13.125 | 6.5716 | 10.786 |

Variously oriented substrates, namely {011}, {110}, {100}, {111} and {201} plates, have been successfully used to give as-grown films with highly specular surfaces. With the exception of very high quality materials, the use of hydrothermally grown materials typically leads to optical degradation with the formation of fine white filaments in the substrate. It is theorized that this degradation is due to the precipitation of fine water-based inclusions in these materials.

The preferred substrates for use in the process of the present invention are 1 cm × 1 cm × 1 mm thick plates, cut parallel to the desired {ijk} growth faces, where {ijk} are the Miller indices. All plates were polished with sequentially finer (3 μm–0.25 μm) Al$_2$O$_3$-based polishing powder, and finished with a 30-seconds chemical-mechanical polish in colloidal silica. A small (about 0.75 mm) hole, drilled at one corner of the substrate, allows it to be tied onto a crystal rotation-pulling head with thin platinum wire. The substrate was held vertically to assist flux drainage after dipping. A slight etching of the substrate in warm dilute hydrochloric acid was found to improve the quality of the epitaxial film.

The dipping setup preferred for use in the present invention consists of a 250 ml crucible placed at the bottom of a short zone top-loading crucible furnace lined by a 4.5 inch inner diameter quartz tube. During a typical dipping experiment, the melt (about 200 ml) is homogenized overnight at about 50° C. above it liquidus temperature, which is determined accurately by repeated seeding. A somewhat longer soak time is often needed when using the K$_6$ flux. The substrate is introduced into the growth furnace slowly (at about 5-25 mm/min.) to avoid cracking. The melt is then cooled to about 1.5°-3° C. below the satuaration point and allowed to equilibrate for 30 minutes. The substrate is then dipped into the melt and spun unidirectionally at 10 rpm. The dipping time varies depending on the desired film thickness, the degree of supersaturation used, the choice of flux and the growth temperature. A slight back-etching of the substrate prior to growth results in significantly better quality film. This is accomplished simply by taking advantage of the thermal inertia of the system by submergence of the substrate before the melt reaches the growth temperature.

Upon completion of the dipping, the plate is withdrawn from the melt and the furnace at about 5-25 mm/min. Any residual flux present is washed-off with warm dilute hydrochloric acid. The thickness of the film is measured approximately (±5 μm) with a micrometer, and more accurately (±0.5 μm) with a microscope.

Using the dipping procedure outlined above, films between 4-20 μm have been grown on a suitably chosen substrate of KTP or KTiOP$_{1-(a+b)}$As$_{(a+b)}$O$_4$. As an independent confirmation of the step-like refractive index profile, electron microprobe technique, specifically Energy-Dispersive X-Ray Spectrometry (EDS), was used to map out the composition of a 50 μm thick KTiOP$_{0.76}$As$_{0.24}$O$_4$ film on a KTP substrate (FIG. 2).

The abrupt increase in the arsenic content from the substrate to the film convincingly demonstrated that phosphorous-arsenic exchange is negligible under growth conditions employed (about 850° C). The phosphorous content of the EDS profiles predicts a film, which is consistent with the As value obtained by the inductively-coupled plasma (ICP) analysis of bulk single crystals grown from the same melt. The growth of thin films of Rb$_{0.2}$K$_{0.8}$TiOPO$_4$ on KTP showed significant penetration of the Rb$^+$ into the substrate, as revealed by EDS. This verified that the K$^+$ ions are highly mobile, and step-index film cannot be obtained from the cationic solid-solutions.

Figure 3:
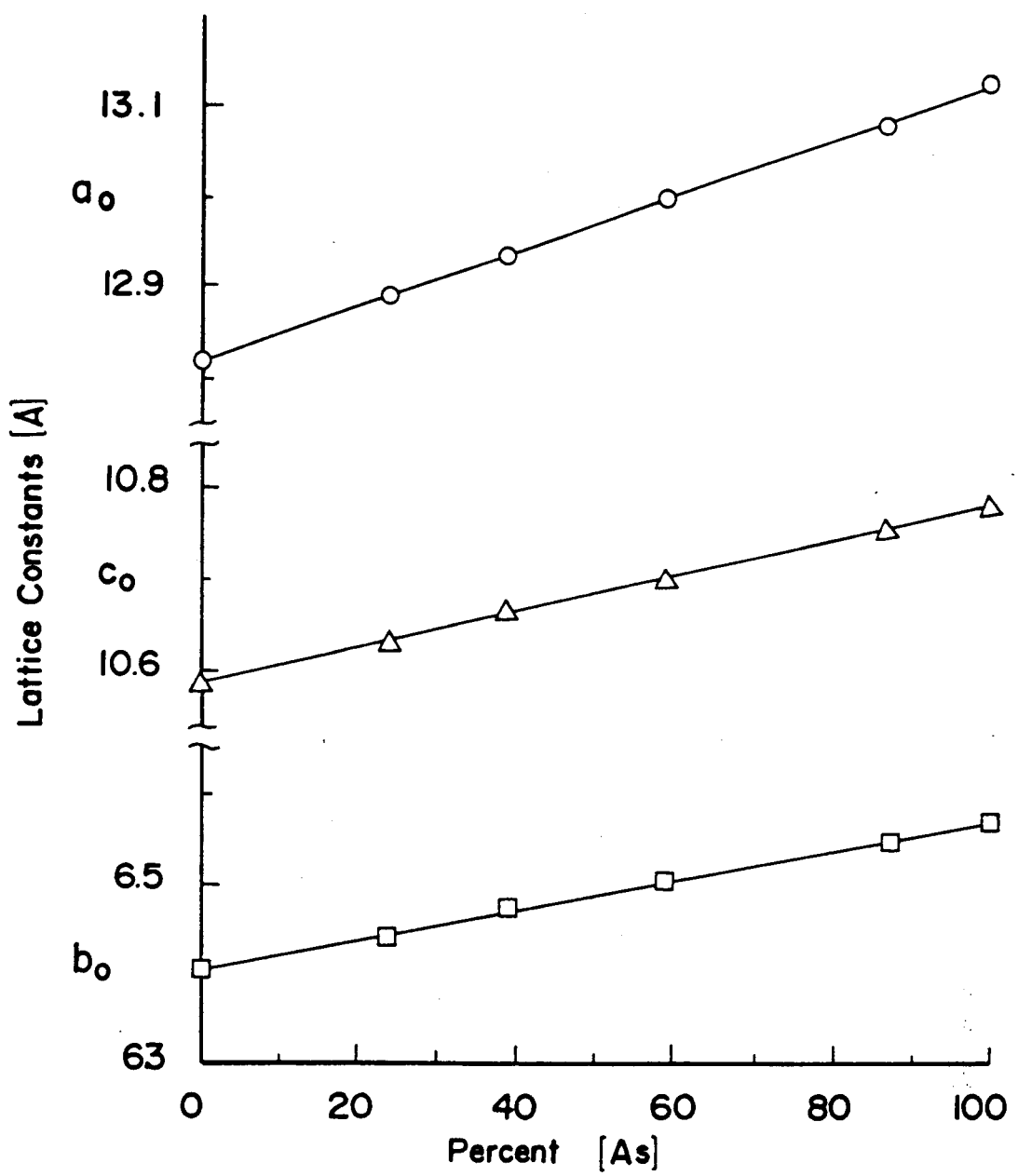
FIG. 3 depicts the lattice parameters of the system $KTiOP_{a+b}As_{1-(a+b)}O_4$ grown in tungstate flux. The solid lines represent predictions using Vegard's law.

Table 3 summarizes the partition coefficients for arsenics using the tungstate flux. The partition coefficient, κ, is defined as:

$$\kappa = \frac{[As] \text{ crystal}}{[As] \text{ melt}}$$

wherein [As] is the mole fraction of As in the crystal or the melt. [As] are determined by inductively-coupled plasma analysis of As and P in bulk crystals grown at the same temperature. A greater than unity partition coefficient suggests that As is favored in the KTiOAs$_{1-a}$P$_a$O$_4$ lattice. FIG. 3 shows a graph of the lattice constants of the KTiOAs$_{1-(a+b)}$P$_{(a+b)}$O$_4$ system as measured by the Guinier technique. The results indicate that, unlike the Rb$_{1-x}$K$_x$TiOPO$_4$ system, the lattice constants, a$_o$, b$_o$ and c$_o$, increase monotonically with arsenic content.

TABLE 3

| [As]$_{crystal}$ | [As]$_{melt}$ | κ |
|---|---|---|
| 24.0 | 20 | 1.20 |
| 39.1 | 35 | 1.12 |
| 56.1 | 50 | 1.12 |
| 82.6 | 75 | 1.10 |
| 87.4 | 80 | 1.10 |

The preferred film/substrate combination is a pure potassium titanyl arsenate film on a suitably chosen KTiOAs$_{1-a}$P$_a$O$_4$ substrate. This combination eliminates possible microscopic compositional fluctuation in the film due to the non-unity partition coefficient κ.

Figure 1B:
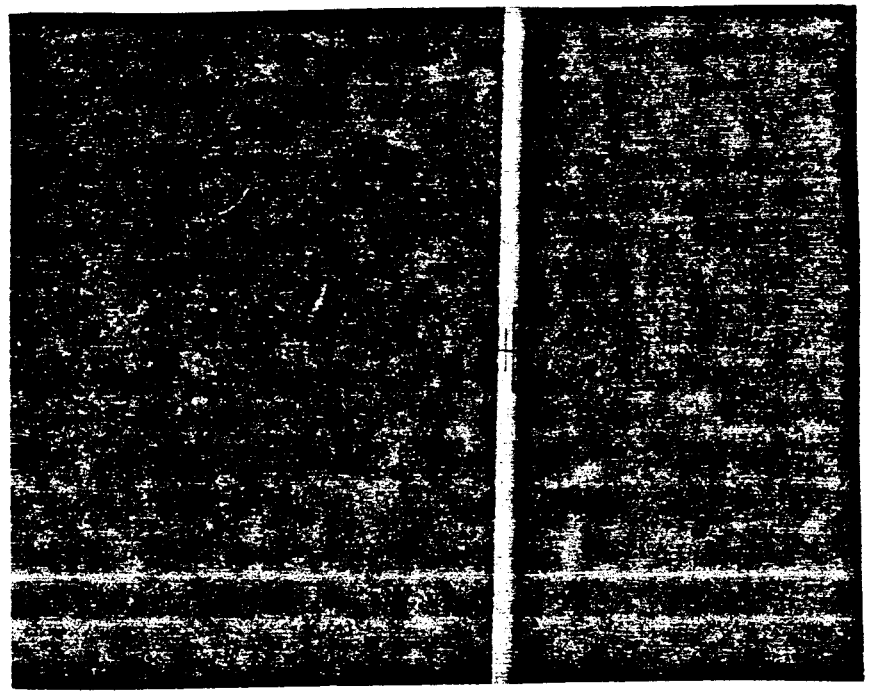
FIG. 1 depicts a comparison of the refractive index profiles of an ion-exchanged channel waveguide (FIG. 1a) and a planar 4 μm thick $KTiOAsO_4$ waveguide grown on a $KTiOP_{0.17}As_{0.83}O_4$ substrate of the present invention (FIG. 1b). The scale is 2 μm/division.
Figure 1A:
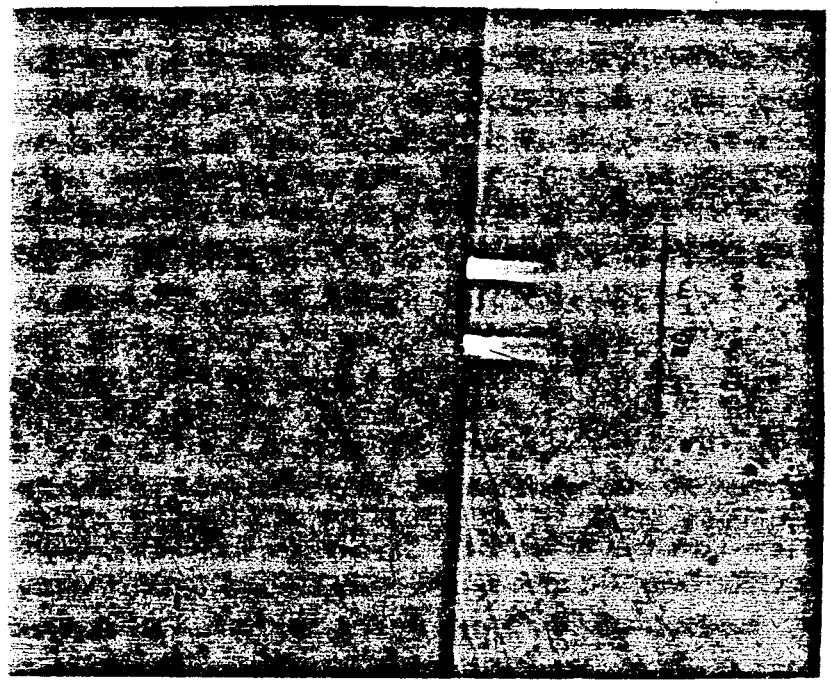

Although compositional variation in the KTiOAs$_{1-a}$P$_a$O$_4$ substrate can, in principle, occur, its effect on the waveguiding properties is negligible as it interacts with the weak evanescent field. FIG. 1b shows the refractive index profile of a 4 μm KTA film grown on a {011} KTiOP$_{0.17}$As$_{0.83}$O$_4$ substrate. The film was shown to waveguide effectively at 0.632 μm, with no more than two optical modes. FIG. 1a shows for comparison the refractive index profile of an ion-exchanged channel waveguide.

The present invention further comprises a process for producing an optical waveguide comprising:

a) growing by liquid phase epitaxy a thin film of M$_{1-x}$N$_x$TiAs$_{1-a}$P$_a$O$_5$ on a substrate of MTiAs$_{1-(a+b)}$P$_{a+b}$O$_5$ wherein M and N are each independently potassium, rubidium, cesium, or thallium;

a is 0 to 1;

b is greater than 0 and less than or equal to (1−a);

(a+b) is greater than 0 and less than or equal to 1; and x is 0 to 1, said film is heteroepitaxial with respect to said substrate; and the refractive index of said film is greater than the refractive index of said substrate by at least about 0.001, provided that when M or N is rubidium, the concentration of rubidium in the film is equal to that in the substrate; by immersing substrate seed crystal into a supercooled melt of a suitable flux, withdrawing the seed crystal from the melt, and effecting cooling thereof, resulting in supersaturation of the flux solution on the seed and growth of a crystal film of $M_{1-x}N_xTiAs_{1-a}P_aO_5$; and b) contacting the substrate and film of a) with a molten salt of molten mixture of salts of at least one salt of rubidium, cesium, thallium, barium, strontium, calcium or zinc at a temperature of from about 200° to about 600° C.

Step (a) of this process is conducted as described above. In step b) the substrate and film prepared by the liquid phase epitaxy procedure of step a) is then contacted with a molten salt, or mixture of salts to further slightly increase the surface index of refraction. The waveguide of step (a) has a refractive index profile that is step-like. This is slightly diffused to an S shape profile by the treatment with molten salts.

Salts suitable for use herein include salts of at least one of rubidium, cesium, thallium, calcium, strontium, barium or zinc. Preferred is at least one of rubidium, cesium or thallium in the presence of one or more of calcium, strontium, barium or zinc. Especially suitable are nitrate or chloride salts. The use of a solution containing divalent ions with the monovalent ones provides additional control of waveguide refractive index and thickness and increases conduction.

The substrate and film are contacted with the molten salt at a temperature of from about 200° to about 600° C., preferably from about 300° to about 450° C. The substrate and film are contacted with the molten salt at the above temperature for a time sufficient to increase the surface index of refraction by at least about 0.00025, generally from about 15 minutes to about 6 hours. Methods of contacting and the preparation of the molten solutions employed are known to those skilled in the art. U.S. Pat. No. 4,766,954 describes examples of such and is herein incorporated by reference.

The optical waveguides of the present invention are useful for waveguided nonlinear optical and electrooptical device applications. The liquid phase epitaxy process for preparation of such waveguides offers flexibility in device design and manufacturing. Examples of possible utility of the present invention are the fabrication of waveguide second harmonic generation devices suitable for use in optical recording, and the fabrication of electrooptic modulators for optical communication.

The following examples illustrate the present invention but are not intended to limit it in any way.

EXAMPLE 1

A charge consisting of 244.5 g $K_2WO_4$, 65.4 g $Li_2WO_4$, 113.0 g $KH_2PO_4$, 37.4 g $KH_2AsO_4$ and 23.0 g $TiO_2$ (corresponding to a 20 mole % [As] in solution) was melted in a 250 ml platinum crucible at about 900° C. in a short zone top-loading crucible furnace lined by a 4.5 inch inner diameter quartz tube and soaked overnight. A polished (011) $KTiOPO_4$ plate of $10 \times 13 \times 1$ mm$^3$ was dipped into the melt at 883° C. for 60 minutes spinning unidirectionally at 10 rpm. The plate was withdrawn from the melt and washed with warm dilute HCl. A 50 μm thick $KTiOAs_{0.24}P_{0.76}O_4$ film (i.e., 24 mole % [As]) with an abrupt increase in arsenic content as revealed by electron microprobe analysis was obtained. The supersaturation was estimated to be about 5° C. Waveguiding in this film was demonstrated at 632 nm and the refractive index change Δη in the film was measured to be 0.012. The existence of a step like refractive index profile was inferred by: 1) direct microscopic observation; 2) optical refractive index measurement being consistent with a step index profile; and 3) the abrupt compositional change in the film.

EXAMPLE 2

A charge consisting of 212.3 g $KH_2AsO_4$, 35.0 g $K_2CO_3$, and 12.4 g $TiO_2$ was melted in a 100 ml platinum crucible at about 940° C. and soaked overnight. A polished (201) $KTiOAs_{0.85}P_{0.15}O_4$ plate of $10 \times 13 \times 1$ mm$^3$ was dipped into the melt at 909° C. for 75 minutes using the method of Example 1. A waveguiding pure $KTiOAsO_4$ film of 10 μm thick was obtained. It was estimated that the supersaturation was $\geq$ b 4° C.

EXAMPLE 3

A charge consisting of 106.3 g $Rb_2WO_4$, 161.8 g $K_2WO_4$, 65.4 g $Li_2WO_4$, 141.2 $KH_2PO_4$ and 23.0 g $TiO_2$ (corresponding to a 20 mole % [Rb] in solution) was melted in a 250 ml platinum crucible at about 940° C. and soaked until a homogeneous solution resulted. A polished (011) $KTiOPO_4$ plate of $10 \times 10 \times 1.3$ mm$^3$ was dipped into the melt at 865° C. for 25 minutes using the method of Example 1 to give 10 μm growth of a $Rb_yK_{1-y}TiOPO_4$ film. Electron microprobe analysis of this film/substrate combination revealed a significant broadening of the film thickness due to the Rb <-> K ion-exchange process, leading to a refractive index profile with an exponential profile as shown in FIG. 6 and not a step index profile.

EXAMPLE 4

A charge consisting of 244.5 g $K_2WO_4$, 65.4 g $Li_2WO_4$, 70.6 g $KH_2PO_4$, 93.4 g $KH_2AsO_4$ and 23.0 g $TiO_2$ (corresponding to a 50 mole % [As] in solution) was melted in a 250 ml platinum crucible at about 950° C. and soaked overnight. A polished (011) $KTiOAs_{0.24}P_{0.76}O_4$ plate of 60 mm$^2$ $\times 2$ mm was dipped into the melt at 898° C. for 90 minutes using the method of Example 1 to give a $KTiOAs_{0.59}P_{0.41}O_4$ film of 22 μm thick. The film is smooth and clear throughout except for a small regions near the edge which cracked as a result of the large lattice mismatch involved.

EXAMPLE 5

A charge consisting of 319.5 g $K_2WO_4$, 85.5 g $Li_2WO_4$, 110.5 g $KH_2AsO_4$ and 23.0 g $TiO_2$ was melted in a 250 ml platinum crucible at about 925° C. and soaked overnight. A polished (011) $KTiOAs_{0.83}P_{0.17}O_4$ plate of 50 mm$^2 \times 0.6$ mm was dipped into the melt at 981° C. for 6 minutes to give a waveguiding pure $KTiOAsO_4$ film of 4 μm thick. Waveguiding experiments indicate the presence of the two lowest order modes.

What is claimed is:

1. A waveguide comprising an homogeneous film of $M_{1-x}N_xTiAs_{1-a}P_aO_5$ on a substrate of $MTiAs_{1-(a+b)}P_{a+b}O_5$ wherein M and N are each independently potassium, rubidium, cesium or thallium;

a is 0 to 1;

b is greater than 0 and less than or equal to (1−a);

(a+b) is greater than 0 and less than or equal to 1; and x is 0 to 1;
said film is heteroepitaxial with respect to said substrate; and the refractive index of said film is greater than the refractive index of said substrate by at least about 0.001; provided that when M or N is rubidium, the concentration of rubidium in the film is equal to that in the substrate.

2. The waveguide of claim 1 wherein b is a maximum of about 0.3.

3. The waveguide of claim 1 wherein a is 0.

4. The waveguide of claim 1 wherein (a+b) is 1.

5. The waveguide of claim 1 wherein M and N are each potassium, rubidium, or thallium.

6. The waveguide of claim 5 wherein M and N are each potassium.

7. The waveguide of claim 6 wherein b is a maximum of 0.3.

8. The waveguide of claim 1 wherein the film comprises $KTiOAs_{1-a}P_aO_5$ and the substrate comprises $KTiPO_5$.

9. The waveguide of claim 8 wherein a is about 0.7.

10. The waveguide of claim 1 wherein the film is $KTiAs_{1-a}P_aO_5$ and the substrate is $KTiAs_{1-(a+b)}P_{a+b}O_5$.

11. The waveguide of claim 10 wherein a is about 0.4 and b is about 0.3.

12. The waveguide of claim 1 wherein the film comprises $KTiAsO_5$ and the substrate comprises $KTiAs_{1-(a+b)}P_{a+b}O_5$.

13. The waveguide of claim 12 wherein a is 0 and b is about 0.2.

14. The waveguide of claim 1 or 6 wherein the refractive index of the film is greater than the refractive index of the substrate by an amount of from about 0.001 to about 0.06.

15. The waveguide of claim 14 wherein the refractive index of the film is greater than the refractive index of the substrate by an amount of from about 0.001 to about 0.03.

16. The waveguide of claim 1 wherein the thickness of the film is from about 0.5 to about 50 microns.

17. The waveguide of claim 16 wherein the thickness of the film is from about 3 to about 5 microns.

18. A process for the liquid phase epitaxial growth of a thin film of $M_{1-x}N_xTiAs_{1-a}P_aO_5$ on a substrate of $MTiAs_{1-(a+b)}P_{a+b}O_5$ wherein M and N are each independently potassium, rubidium, cesium, or thallium;

a is 0 to 1;

b is greater than 0 and less than or equal to (1−a);

(a+b) is greater than 0 and less than or equal to 1; and x is 0 to 1;

and wherein said film is heteroepitaxial with respect to said substrate, and the refractive index of said film is greater than the refractive index of said substrate by at least about 0.001, provided that when M or N is rubidium, the concentration of rubidium in the film is equal to that in the substrate;

comprising the steps of immersing substrate seed crystal into a supercooled melt of a suitable flux, withdrawing the seed crystal from the melt, and effecting cooling thereof, resulting in supersaturation of the flux solution on the seed and growth of a crystal film of $M_{1-x}N_xTiAs_{1-a}P_aO_5$.

19. The process of claim 18 wherein the flux comprises a tungstate, phosphate, arsenate, molybdate, sulfate, halide or combination thereof which results in crystallization of $M_{x-1}N_xTiAs_{1-a}P_aO_5$ as the only stable solid phase.

20. The process of claim 19 wherein the flux comprises tungstate or phosphate/arsenate.

21. The process of claim 18 wherein said film is heteroepitaxial with respect to said substrate and the refractive index of said film is greater than the refractive index of said substrate by at least about 0.001.

22. The process of claim 18 wherein b is a maximum of about 0.3.

23. The process of claim 22 wherein the resulting film thickness is from about 3 to about 5 microns.

24. A waveguide prepared by the process of claim 18.

25. The waveguide of claim 24 wherein a is 1.

26. A process for producing an optical waveguide comprising:

a) growing by liquid phase epitaxy a thin film of $M_{1-x}N_xTiAs_{1-a}P_aO_5$ on a substrate of $MTiAs_{1-(a+b)}P_{a+b}O_5$ wherein M and N are each independently potassium, rubidium, cesium or thallium;

a is 0 to 1;

b is greater than 0 and less than or equal to (1−a);

(a+b) is greater than 0 and less than or equal to 1; and x is 0 to 1;

and wherein said film is heteroepitaxial with respect to said substrate, and the refractive index of said film is greater than the refractive index of said substrate by at least about 0.001, provided that when M or N is rubidium, the concentration of rubidium in the film is equal to that in the substrate;

by immersing substrate seed crystal into a supercooled melt of a suitable flux, withdrawing the seed crystal from the melt, and effecting cooling thereof, resulting in supersaturation of the flux solution on the seed and growth of a crystal film of $M_{1-x}N_xTiAs_{1-a}P_aO_5$; and b) contacting the substrate and film of (a) with a molten salt or molten mixture of salts of at least one salt of rubidium, cesium, thallium, strontium, calcium, zinc or barium at a temperature of from about 200° to about 600° C.

27. A waveguide prepared by the process of claim 26.

* * * * *